United States Patent
Lee (10) Patent No.: US 6,714,074 B2
(45) Date of Patent: Mar. 30, 2004

(54) POWER AMPLIFIER CLIPPING CIRCUIT FOR MINIMIZING OUTPUT DISTORTION

(75) Inventor: Jeoung-in Lee, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/241,030

(22) Filed: Sep. 11, 2002

(65) Prior Publication Data

US 2003/0141928 A1 Jul. 31, 2003

(30) Foreign Application Priority Data

Jan. 26, 2002 (KR) .......................................... 2002-4647

(51) Int. Cl.[7] .............................................. H03F 3/45
(52) U.S. Cl. ........................ 330/252; 330/257; 327/359
(58) Field of Search ................................ 330/252, 255, 330/257, 258, 261; 327/359

(56) References Cited

U.S. PATENT DOCUMENTS 5,319,267 A  *  6/1994 Kimura ........................ 327/122
5,479,137 A  * 12/1995 Harford ................... 331/117 R
5,552,742 A  *  9/1996 Perkins ........................ 327/563

* cited by examiner

Primary Examiner—Henry Choe
(74) Attorney, Agent, or Firm—F. Chau & Associates, LLC (57) ABSTRACT

A power amplifier clipping circuit prevents sudden output changes when clipped from excessive input voltage, and includes an input voltage divider, two bias transistors connected to a positive voltage source, a third bias transistor connected to the first bias transistor and a first differential amplifier, a first current source connected to the third bias transistor and a negative voltage source and the first differential amplifier, fourth and fifth bias transistors connected to a negative voltage source and a second differential amplifier, a sixth bias transistor connected to the fourth bias transistor and the second differential amplifier, a second current source connected to the sixth bias transistor and a positive voltage source, a first output voltage controller connected between the negative voltage source and an output with a serial input resistor, and a second output voltage controller connected between the positive voltage source and the output and power amplifier.

20 Claims, 5 Drawing Sheets

POWER AMPLIFIER CLIPPING CIRCUIT FOR MINIMIZING OUTPUT DISTORTION

BACKGROUND OF THE INVENTION

1. Field of the Invention

The present invention relates to a power amplifier circuit, and more particularly, to a power amplifier clipping circuit that smoothes a sudden signal change when an output waveform is clipped, and generates the same output waveform for unclipped portions as the original waveform.

2. Description of the Related Art

A power amplifier, which generally uses a plurality of transistors or integrated circuit ("IC") devices, is an apparatus that allows an input to control a power source to produce some useful output. For example, using a power amplifier, a voice signal output from an audio apparatus may have a higher gain and better sound quality.

The power amplifier circuit has a feedback loop which feeds an output signal back to the power amplifier circuit. When an excessive input voltage is provided to the power amplifier circuit, or the power supply circuit becomes inoperable due to a short circuit, the output waveform of the power amplifier circuit is distorted. This distortion is usually referred to as clipping. For the interval when the output waveform is clipped, the feedback loop of the power amplifier circuit cannot operate.

Figure 1:
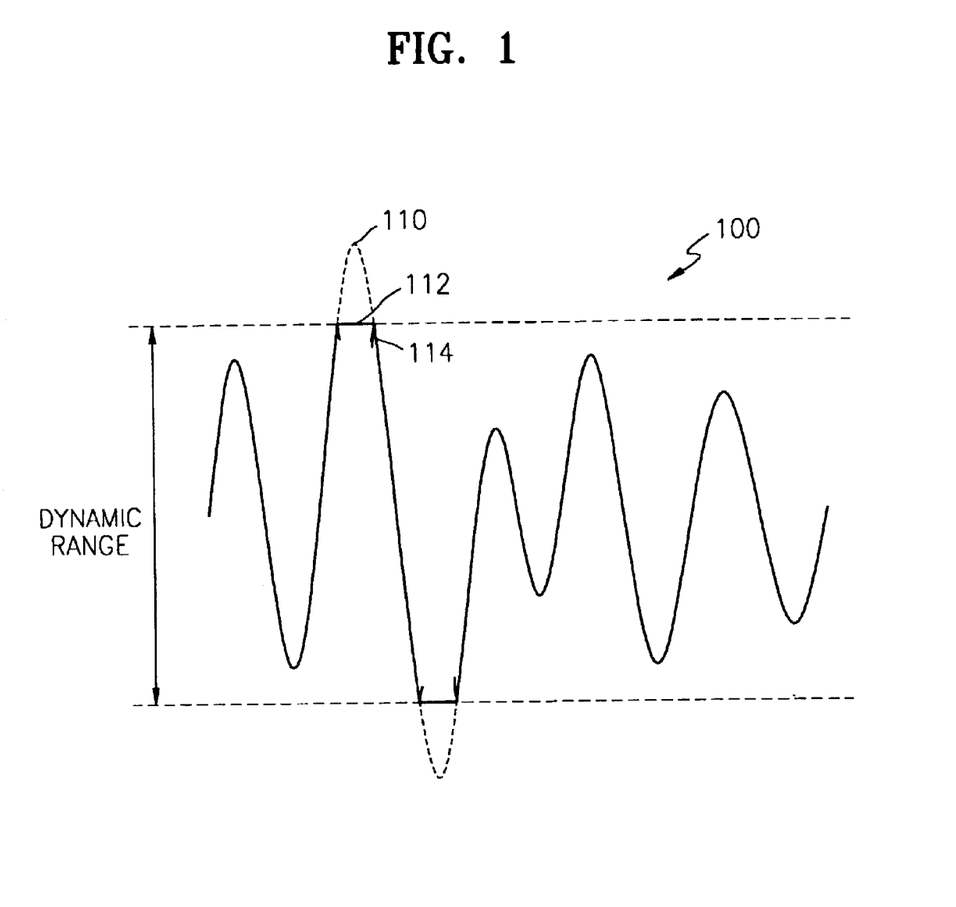
FIG. 1 is a waveform diagram showing the output waveform of a typical power amplifier clipping circuit.

FIG. 1 is a waveform diagram, generally indicated by the reference numeral 100, showing the input waveform 110 and the output waveform 112 of a typical power amplifier clipping circuit. Referring to FIG. 1, the dotted lines 110 outside the dynamic range show the original waveform when the output waveform was not distorted, while the solid lines 112 show the output waveform after clipping. It is shown that when an excessive input is provided, the portions that exceed the dynamic range of the power amplifier are clipped. High-frequency noise 114 is introduced at the clipping transitions. In particular, this is a serious problem in the case of a high-gain amplifier connected to a high inductance external speaker, such as when high-frequency noise 114 as shown in FIG. 1 appears while the output waveform is clipped and annoys the listener.

Figure 2:
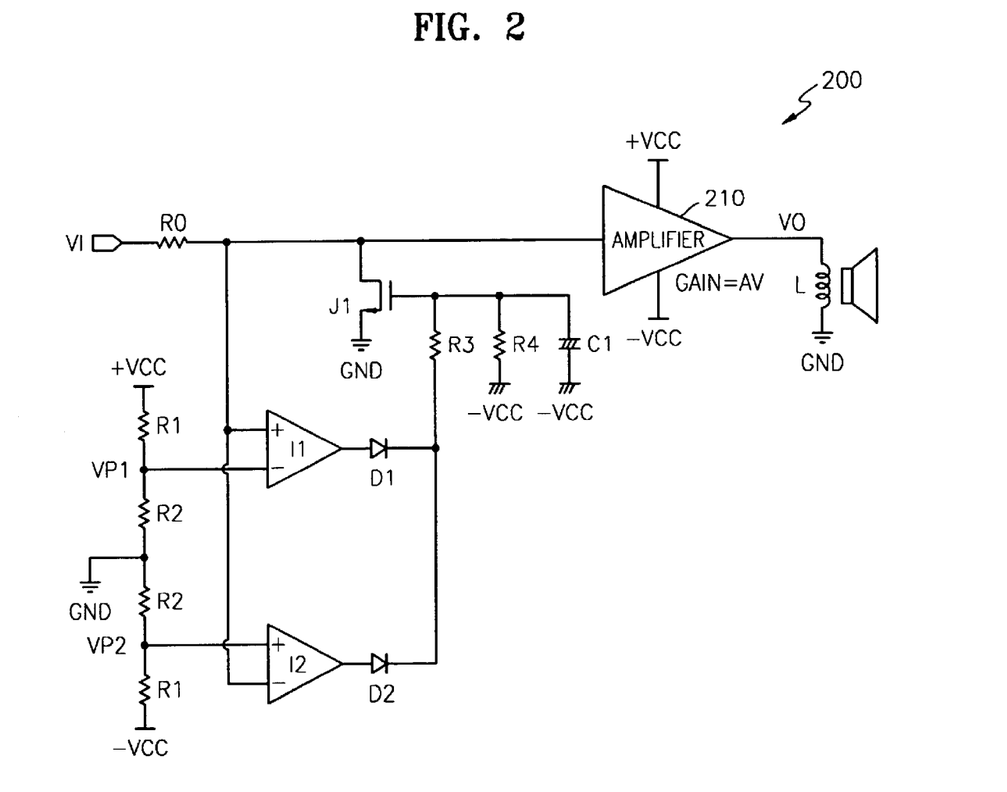
FIG. 2 is a circuit diagram showing a typical power amplifier clipping circuit for preventing output distortion.

FIG. 2 is a circuit diagram showing a typical power amplifier clipping circuit for reducing output clipping. Referring to FIG. 2, the typical power amplifier clipping circuit 200 comprises the resistors R1 and R2 which are serially connected between a positive external power voltage +VCC and ground GND, and between ground GND and a negative external power voltage −VCC, respectively; a first comparator I1 which receives a predetermined first voltage VP1 that is divided by the resistors R1 and R2, and an input voltage VI, compares the two voltages and outputs the larger result; a second comparator I2, which receives a predetermined second voltage VP2 that is divided by the resistors R1 and R2 and the input voltage VI, compares the two voltages and outputs the larger result; a first diode D1 which receives the output of the first comparator I1; a second diode D2 which receives the output of the second comparator I2; a capacitor C1 which is charged by the output of the first diode D1 and the second diode D2; a transistor J1 which operates charged by the capacitor C1; resistors R0, R3, and R4; and an inductor L of an external speaker.

Figure 3:
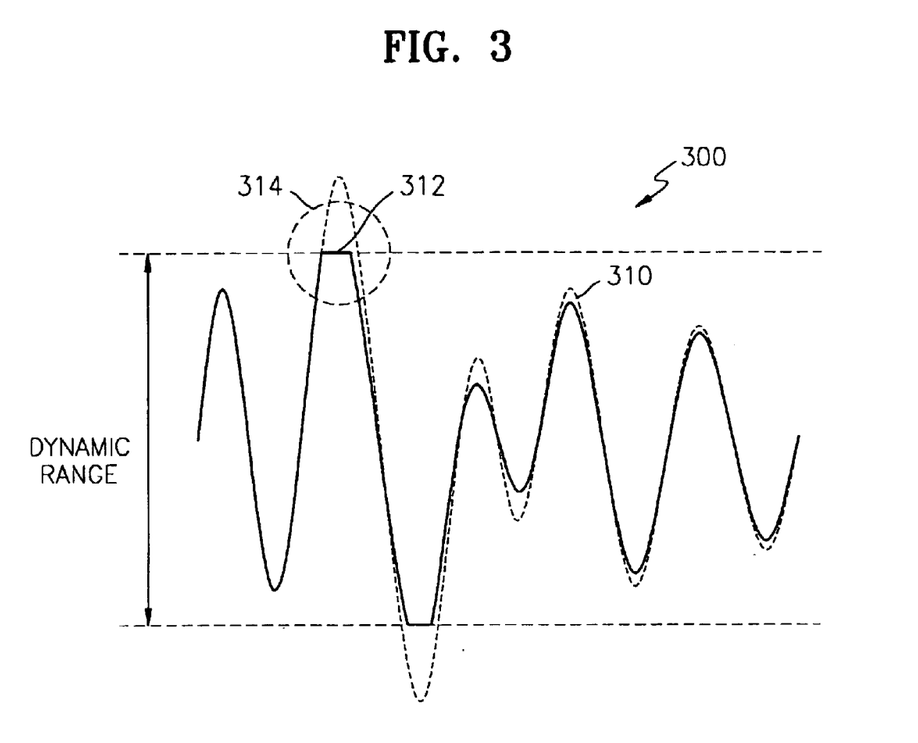
FIG. 3 is a waveform diagram showing the output waveform of the typical power amplifier clipping circuit of FIG. 2.

FIG. 3 is a waveform diagram 300 showing the output waveform 312 of the power amplifier clipping circuit of FIG. 2. The original waveform is indicated generally by the reference numeral 310 for comparison. Although clipping takes place in the regions 314, additional distortion between the original waveform 310 and the output waveform 312 can be seen between the respective plots in other regions as well. The power amplifier clipping circuit 200 is to improve the high frequency noise shown in the output waveform of FIG. 1. Although the high-frequency noise may be reduced by the power amplifier clipping circuit 200 of FIG. 2, the capacitor C1 causes the additional distortion as shown by the differences between the output waveform 312 and the input waveform 310.

The operation of the typical power amplifier clipping circuit 200 will now be explained. If the gain of the amplifier 210 is AV, and the values of resistors R1 and R2 are set so that (R1+R2)/R2=AV, the first voltage VP1 and the second voltage VP2 have the same value as the value of the input voltage VI at which the output V0 of the amplifier 210 is clipped. In this case, it is assumed that the dynamic range of the amplifier 210 is given by the interval defined by the positive external power source voltage +VCC and the negative external power source voltage −VCC. Although the devices inside the amplifier 210 limit this dynamic range, this deviation can be compensated by adjusting the values of the resistors R1 and R2. Thus, taking the dynamic range as above is a reasonable assumption for convenience of explanation.

When the input voltage VI is less than the first voltage VP1 and greater than the second voltage VP2, that is, in a normal operation interval, the outputs of the first comparator I1 and the second comparator I2 have negative values, and therefore, the outputs of the first comparator I1 and the second comparator I2 are blocked by the first diode D1 and the second diode D2, and the capacitor C1 is not charged. Accordingly, the electric potential of the capacitor C1 is 0V and the transistor J1 is turned off. Since current does not flow through the resistor R0 that is serially connected to the input voltage VI, a voltage drop does not occur, and the entire input voltage VI is provided to the amplifier such that a normal operation is performed.

However, when the input voltage VI is greater than the first voltage VP1, that is, when an excessive input voltage is provided to the power amplifier clipping circuit 200, the output of the second comparator I2 is still at a negative value, but the output of the first comparator I1 is at a positive value, the first diode D1 is turned on and the capacitor C1 is charged. Therefore, the transistor J1 is turned on, and the input voltage VI reaches a value which is divided by the resistor R0 and the turn-on resistance of the transistor J1, and since the value is less than the original input voltage, VI is provided to the amplifier 210. Here, the transistor J1 is a junction field effect transistor ("JFET"). From the aspect of the amplifier 210, the feedback loop (not shown) is continuously maintained while generation of the high frequency noise is curbed as shown in FIG. 3, and the output waveform is clipped.

It shall be understood that when the input voltage VI is less than the second voltage VP2, the result is similar to the case when the input voltage VI is greater than the first voltage VP1. Accordingly, the duplicate explanation will be omitted.

However, when the power amplifier clipping circuit 200 having the circuit structure as shown in FIG. 2 is used, the capacitor C1 should be in the circuit. In addition, if, as shown in FIG. 3, the input voltage VI, which is greater than the first voltage VP1, is provided to the power amplifier clipping circuit 200 and the capacitor C1 is charged by the resistor R4, the transistor J1 is turned on until the current is completely discharged from the capacitor C1, and the input voltage VI is divided. Accordingly, even though a normal input voltage VI is provided again after the excessive input voltage VI is provided, the output waveform V0 of the amplifier 210 is smaller than the normal output waveform V0, as indicated by dotted waveform in FIG. 3, for a predetermined interval or until the current in the capacitor C1 is completely discharged, and the output signal becomes different from the original one. Thus, the added distortion In addition, the device presented in the European Patent Application No. 88108772.0, which displays a circuit structure different from that of the power amplifier clipping circuit 200 of FIG. 2, but that has a clipping detector and a voltage controlled attenuator to reduce distortion of the output waveform, also requires a capacitor and therefore has the same problem of additional distortion as the power amplifier clipping circuit 200 of FIG. 2.

SUMMARY OF THE INVENTION

To solve the above problems, embodiments of the present invention provide a power amplifier clipping circuit, which, without adding a capacitor, prevents or smoothes a sudden change in the output waveform when the output waveform is clipped due to an excessive input voltage, and makes the output waveform for unclipped portions occurring immediately after providing the excessive input voltage the same as the original waveform.

Accordingly, there is provided a power amplifier clipping circuit comprising an input voltage level dividing unit which generates a first dividing voltage and a second dividing voltage that divide an interval to which the level of an input voltage belongs; a first bias transistor and a second bias transistor which are connected to a positive internal power source voltage, the first and second bias transistors forming a current mirror and providing a bias voltage to a predetermined first differential amplifying unit; a third bias transistor which is connected to the first bias transistor and provides a bias voltage to the first differential amplifying unit; a first constant current source which is connected to the third bias transistor and a negative internal power source voltage, and controls the third bias transistor; the first differential amplifying unit which receives the first dividing voltage and the input voltage, and if the level of the input voltage is between the first dividing voltage and a predetermined first clipping voltage, generates a first output signal, while if the level of the input voltage exceeds the first dividing voltage, generates a second output signal; a fourth bias transistor and a fifth bias transistor which are connected to a negative internal power source voltage, the fourth and fifth bias transistors forming a current mirror, and providing a bias voltage to a predetermined second differential amplifying unit; a sixth bias transistor which is connected to the fourth bias transistor and provides a bias voltage to the second differential amplifying unit; a second constant current source which is connected to the sixth bias transistor and a positive internal power source voltage, and controls the sixth bias transistor; the second differential amplifying unit which receives the second dividing voltage and the input voltage, and if the level of the input voltage is between a predetermined second clipping voltage and the second dividing voltage, generates a third output signal, while if the level of the input voltage exceeds the second dividing voltage, generates a fourth output signal; a first output voltage control unit which is connected between the negative internal power source voltage and an output node in which an input resistor that is serially connected to the input voltage is connected to a power amplifier, and in response to the first and second output signals, lowers the level of the input voltage and provides the input voltage to the power amplifier; and a second output voltage control unit which is connected between the positive internal power source voltage and the output node, and in response to the third and the fourth output signal, raises the level of the input voltage and provides the input voltage to the power amplifier.

It is preferable that the input voltage level dividing unit comprises a first dividing resistor, an end of which is connected to a positive external power source voltage and the other end of which is connected to a first node generating the first dividing voltage; a second dividing resistor, an end of which is connected to the first node, and the other end of which is connected to ground; a third dividing resistor, an end of which is connected to ground, and the other end of which is connected to a second node generating the second dividing voltage; and a fourth dividing resistor, an end of which is connected to the second node, and the other end of which is connected to a negative external power source voltage.

It is preferable that the second dividing resistor and the third dividing resistor have an identical resistance value, and the first dividing resistor and the fourth dividing resistor have an identical resistance value.

It is preferable that the gain of the power amplifier is given by the value obtained by dividing the sum of the resistance value of the first dividing resistor and the resistance value of the second dividing resistor by the resistance value of the second dividing resistor.

It is preferable that the first differential amplifying unit comprises a first drop differential transistor, the collector of which is connected to the collector and base of the second bias, and to the base of which the first dividing voltage is provided; a second drop differential transistor, the collector of which is connected to the collector and base of the second bias transistor and to the base of which the input voltage is provided; a third drop differential transistor, the emitter of which is connected to the emitter of the first drop differential transistor, the base of which is connected to the base of the third bias transistor, and the collector of which generates the second output signal; a fourth differential transistor, the emitter of which is connected to the emitter of the second drop differential transistor, and the base of which is connected to the base of the third bias transistor; and a first active load unit which is connected between the collectors of the third and fourth drop differential transistors and the negative internal power source voltage, and generates the first output signal.

It is preferable that the first active load unit comprises a first drop load transistor, the collector of which is connected to the collector of the third drop differential transistor, and the emitter of which is connected to the negative internal power source voltage; and a second drop load transistor, the collector of which is connected to the collector of the fourth drop differential transistor, the base and collector of which are commonly connected to the base of the first drop load transistor, and the emitter of which is connected to the negative internal power source voltage, wherein the first output signal is output from the bases of the first and second drop load transistors.

It is preferable that the power amplifier clipping circuit further comprises a plurality of resistance devices between the first and third drop differential transistors, and between the second and fourth drop differential transistors.

It is preferable that the first clipping voltage is less than the input voltage of the moment when clipping the output waveform of the power amplifier begins, by 2n times the threshold voltage of the drop differential transistors, where n denotes the number of drop differential transistors.

It is preferable that the input voltage when clipping the output waveform of the power amplifier begins has the same level as the first dividing voltage.

It is preferable that the second differential amplifying unit comprises a first rise differential transistor, the collector of which is connected to the collector and base of the fifth bias transistor, and to the base of which the second dividing voltage is provided; a second rise differential transistor, the collector of which is connected to the collector and base of the fifth bias transistor, and to the base of which the input voltage is provided; a third rise differential transistor, the emitter of which is connected to the emitter of the first rise differential transistor, the base of which is connected to the base of the sixth bias transistor, and the collector of which generates the fourth output signal; a fourth rise differential transistor, the emitter of which is connected to the emitter of the second rise differential transistor, and the base of which is connected to the base of the sixth bias transistor; and a second active load unit which is connected between the collectors of the third and fourth rise differential transistors, and the positive internal power source voltage, and generates the third output signal.

It is preferable that the second active load unit comprises a first rise load transistor, the collector of which is connected to the collector of the third rise differential transistor, and the emitter of which is connected to the positive internal power source voltage; and a second rise load transistor, the collector of which is connected to the collector of the fourth rise differential transistor, the base and collector of which are commonly connected to the base of the first rise load transistor, and the emitter of which is connected to the positive internal power source voltage, wherein the third output signal is output from the bases of the first and second rise load transistors.

It is preferable that the power amplifier clipping circuit further comprises a plurality of resistance devices between the first and third rise differential transistors, and between the second and fourth rise differential transistors.

It is preferable that the second clipping voltage is greater than the input voltage of the moment when clipping the output waveform of the power amplifier begins, by 2m times the threshold voltage of the rise differential transistors, where m denotes the number of rise differential transistors.

It is preferable that the input voltage of the moment when clipping the output waveform of the power amplifier begins has the same level as the second dividing voltage.

It is preferable that the first output voltage control unit comprises a first drop control transistor, the emitter of which is connected to the negative internal power source voltage, to the base of which the first output signal is provided, and the collector of which is connected to the output node; and a second drop control transistor, the emitter of which is connected to the negative internal power source voltage, to the base of which the second output signal is provided, and the collector of which is connected to the output node.

It is preferable that the second output voltage control unit comprises a first rise control transistor, the emitter of which is connected to the positive internal power source voltage, to the base of which the third output signal is provided, and the collector of which is connected to the output node; and a second rise control transistor, the emitter of which is connected to the positive internal power source voltage, to the base of which the fourth output signal is provided, and the collector of which is connected to the output node.

Therefore, the power amplifier clipping circuit according to the present invention prevents a sudden change in the output waveform when the output waveform is clipped due to an excessive input voltage, and makes the output waveform occurring immediately after providing the excessive input voltage the same as the original waveform.

BRIEF DESCRIPTION OF THE DRAWINGS

The above objects and advantages of the present invention will become more apparent by describing in detail preferred embodiments thereof with reference to the attached drawings, in which.

DESCRIPTION OF THE PREFERRED EMBODIMENTS

In the present disclosure, a power amplifier clipping circuit is provided, which, without adding a capacitor, prevents a sudden change in the output waveform and provides smooth clipping when the output waveform is clipped due to an excessive input voltage. In addition, the presently disclosed power amplifier clipping circuit makes the output waveform occurring immediately after providing the excessive input voltage the same as the original waveform. Thus, the power amplifier clipping circuit minimizes output distortion and high frequency noise.

Figure 4:
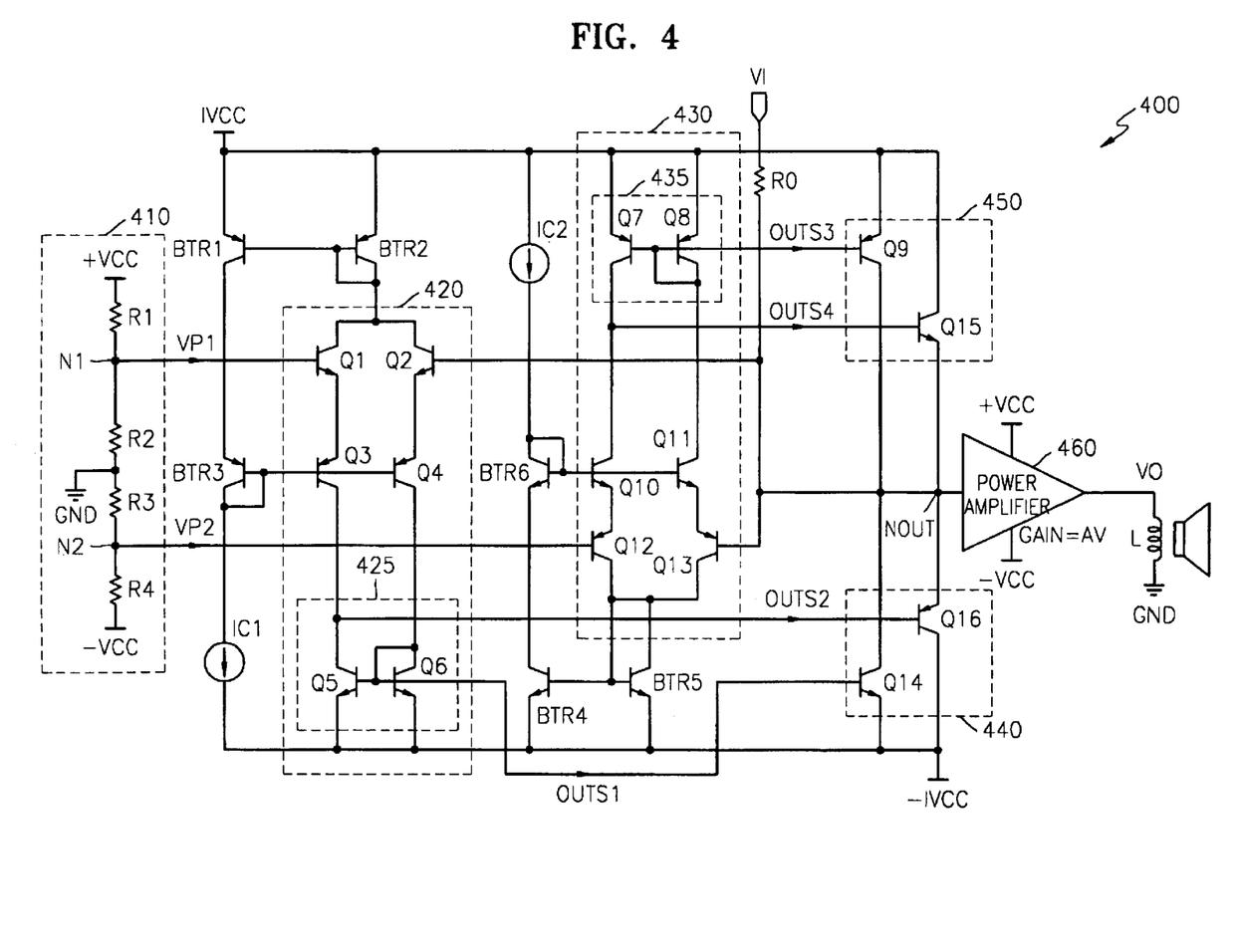
FIG. 4 is a circuit diagram showing a power amplifier clipping circuit according to the present invention.

FIG. 4 is a circuit diagram showing a power amplifier clipping circuit according to the present invention. Referring to FIG. 4, the power amplifier clipping circuit 400 includes an input voltage level dividing unit 410, first through sixth bias transistors BTR1 to BTR6, first and second constant current sources IC1 and IC2, a first differential amplifying unit 420, a second differential amplifying unit 430, a first output voltage control unit 440 and a second output voltage control unit 450.

The input voltage-level dividing unit 410 generates first and second dividing voltages VP1 and VP2, respectively, that divide an interval to which the level of the input voltage VI belongs. More specifically, the input voltage level dividing unit 410 includes a first dividing resistor R1, one end of which is connected to a positive external power source voltage +VCC, and the other end of which is connected to a first node N1 for generating a first dividing voltage VP1; a second dividing resistor R2, one end of which is connected to the first node N1 and the other end of which is connected to ground GND; a third dividing resistor R3, one end of which is connected to ground GND, and the other end of which is connected to a second node N2 generating a second dividing voltage VP2; and a fourth dividing resistor R4, one end of which is connected to the second node N2, and the other end of which is connected to a negative external power source voltage −VCC.

The first and the fourth dividing resistors R1 and R4 have the same resistance value, while the second and the third dividing resistors R2 and R3 have the same resistance value.

The gain of the power amplifier 460 is obtained by dividing the sum of the resistance values of the first dividing resistor R1 and the second dividing resistor R2, by the resistance value of the second dividing resistor R2.

The first and second bias transistors BTR1 and BTR2 are connected to a positive internal power source voltage IVCC to form a current mirror, and provide a bias voltage to the predetermined first differential amplifying unit 420. The first constant current source IC1 is connected between the third bias transistor BTR3 and a negative internal power source voltage −IVCC, and controls the third bias transistor BTR3.

The first differential amplifying unit 420 receives the first dividing voltage VP1 and the input voltage VI, and if the level of the input voltage VI is between a predetermined first clipping voltage VCP1 and the first dividing voltage VP1, generates a first output signal OUTS1. If the level of the input voltage VI exceeds the first dividing voltage VP1, the first differential amplifying unit generates a second output signal OUTS2.

More specifically, the first differential amplifying unit 420 has a first drop differential transistor Q1, the collector of which is connected to the collector and base of the second bias transistor BTE2 and to the base of which the first dividing voltage VP1 is provided; a second drop differential transistor Q2, the collector of which is connected to the collector and base of the second bias transistor BTR2 and to the base of which the input voltage VI is provided; a third drop differential transistor Q3, the emitter of which is connected to the emitter of the first drop differential transistor Q1, the base of which is connected to the base of the third bias transistor BTR3, and the collector of which generates the second output signal OUTS2; a fourth drop differential transistor Q4, the emitter of which is connected to the emitter of the second drop differential transistor Q2, and the base of which is connected to the base of the third bias transistor BTR3; and a first active load unit 425 which is connected between the collectors of the third and fourth drop differential transistors Q3 and Q4, and the negative internal power source voltage −IVCC, and generates the first output signal OUTS1.

The first active load unit 425 has a first drop load transistor Q5, the collector of which is connected to the collector of the third drop differential transistor Q3 and the emitter of which is connected to the negative internal power source voltage −IVCC, and a second drop load transistor Q6, the collector of which is connected to the collector of the fourth drop differential transistor Q4, the base and collector of which are commonly connected to the base of the first drop load transistor Q5, and the emitter of which is connected to the negative internal power source voltage −IVCC. The first output signal OUTS1 is output from the bases of the first and second drop load transistors Q5 and Q6 in the first active load unit 425. More resistors may be further placed between the first and third drop differential transistors Q1 and Q3, and between the second and fourth drop differential transistors Q2 and Q4. Also, the first clipping voltage VCP1 is less than the input voltage VI, when clipping the output waveform V0 of the power amplifier 460 begins, by 2n times the threshold voltage of the drop differential transistors. Here, n denotes the number of drop differential transistors. In a preferred embodiment of the present invention, the input voltage VI is the same as the first dividing voltage VP1 when clipping of the output waveform V0 of the power amplifier 460 begins.

The fourth and fifth bias transistors BTR4 and BTR5 are connected to the negative internal power source voltage −IVCC to form a current mirror, and provides a bias voltage to the predetermined second differential amplifying unit 430. The sixth bias transistor BTR6 is connected to the fourth bias transistor BTR4, and provide's a bias voltage to the second differential amplifying unit 430.

The second constant current source IC2 is connected between the sixth bias transistor BTR6 and the positive internal power source voltage IVCC, and controls the sixth bias transistor BTR6. The second differential amplifying unit 430 receives the second dividing voltage VP2 and the input voltage VI. If the level of the input voltage VI is between the second clipping voltage VCP2 and the second dividing voltage VP2, the second differential amplifying unit 430 generates a third output signal OUTS3. While if the level of the input voltage VI exceeds the second dividing voltage VP2, the second differential amplifying unit 430 generates a fourth output signal OUTS4.

More specifically, the second differential amplifying unit 430 includes a first rise differential transistor Q12, the collector of which is connected to the collector and base of the fifth bias transistor BTR5, and to the base of which the second dividing voltage VP2 is provided; a second rise differential transistor Q13, the collector of which is connected to the collector and base of the fifth bias transistor BTR5, and to the base of which the input voltage is provided; a third rise differential transistor Q10, the emitter of which is connected to the emitter of the first rise differential transistor Q12, and the base of which is connected to the base of the sixth bias transistor BTR6, and the collector of which generates the fourth output signal; a fourth rise differential transistor Q11, the emitter of which is connected to the emitter of the second rise differential transistor Q13, and the base of which is connected to the base of the sixth bias transistor BTR6; and a second active load unit 435 which is connected between the collectors of the third and fourth rise differential transistors Q10 and Q11, and the positive internal power source voltage IVCC, and generates the third output signal OUTS3.

The second active load unit 435 includes a first rise load transistor Q7, the collector of which is connected to the collector of the third rise differential transistor Q10 and the emitter of which is connected to the positive internal power source voltage IVCC, and a second rise load transistor Q8, the collector of which is connected to the collector of the fourth rise differential transistor Q11, the base and collector of which are commonly connected to the base of the first rise load transistor Q7, and the emitter of which is connected to the positive internal power source voltage IVCC. The third output signal OUTS3 is output from the bases of the first and second rise load transistors Q7 and Q8 of the second active load unit 435.

Additional resistors may be placed between the first and third rise differential transistors Q12 and Q10, and between the second and fourth rise differential transistors Q13 and Q11. The second clipping voltage VCP2 is greater than the input voltage VI (when clipping the output waveform V0 of the power amplifier 460 begins), by 2m times the threshold voltage of the rise differential transistors. Here, m denotes the number of rise differential transistors. In a preferred embodiment of the present invention, the input voltage VI of the power amplifier 460 is the same as the second dividing voltage VP2 at the moment when clipping the output waveform V0 begins.

In the first output voltage control unit 440, the input resistor R0 that is serially connected between the negative internal power source voltage −IVCC and the input voltage VI, is applied to the output node NOUT that is connected to the power amplifier 460. The first output voltage control unit 440 lowers the level of the input voltage VI in response to the first and second output signals OUTS1 and OUTS2, and provides the input voltage VI to the power amplifier 460.

More specifically, the first output voltage control unit 440 has a first drop control transistor Q14, the emitter of which is connected to the negative internal power source voltage −IVCC and to the base of which the first output signal OUTS is provided, and a second drop control transistor Q16, the emitter of which is connected to the negative internal power source voltage −IVCC, to the base of which the second output signal OUTS2 is provided, and the collector of which is connected to the output node NOUT.

The second output voltage control unit 450 is connected between the positive internal power source voltage IVCC and the output node NOUT, and increases the level of the input voltage VI in response to the third and fourth output signals OUTS3 and OUTS4. In addition, the second output voltage control unit 450 provides the input voltage VI to the power amplifier 460.

More specifically, the second output voltage control unit 450 includes a first rise control transistor Q9, the emitter of which is connected to the positive internal power source voltage IVCC, to the base of which the third output signal OUTS3 is provided, and the collector of which is connected to the output node NOUT, and a second rise control transistor Q15, the emitter of which is connected to the positive internal power source voltage IVCC, to the base of which the fourth output signal OUTS4 is provided, and the collector of which is connected to the output node NOUT.

Figure 5:
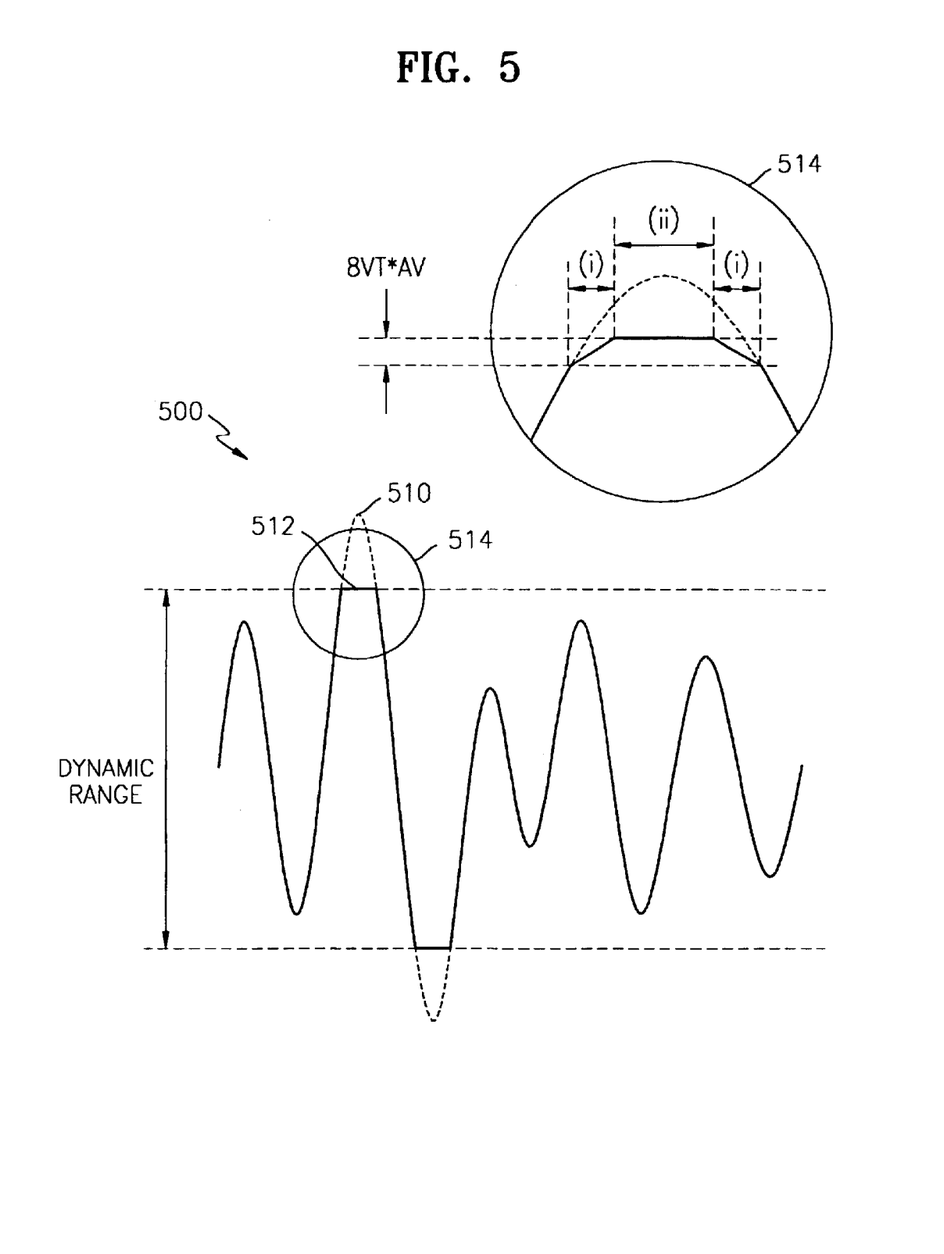
FIG. 5 is a waveform diagram of the output waveform of the power amplifier clipping circuit of FIG. 4.

FIG. 5 is a waveform diagram, indicated generally by the reference numeral 500, of the output waveform of the power amplifier clipping circuit of FIG. 4. Here, an original input waveform 510 is clipped to an output waveform 512 without high-frequency distortion. In addition, substantially no additional distortion is introduced outside of the clipping region 514, as was caused by capacitors and the like in typical circuits.

Referring to FIGS. 4 and 5, the operation of the power amplifier clipping circuit according to the present invention will now be explained in detail. Assuming that the gain of the power amplifier 460 is AV, the first dividing resistor R1 and the second dividing resistor R2 values are first set so that (R1+R2)/R2=AV. Since the third dividing resistor R2 and the fourth dividing resistor R4 are the same as the first dividing resistor R1 and the second dividing resistor R2, respectively, if the resistance values of the first through fourth dividing resistors R1 through R4 are set to satisfy the above equation, the first dividing voltage VP1 and the second dividing voltage VP2 reaches the same value as the input voltage VI when the output V0 of the power amplifier 460 is clipped. In this case, it is assumed that the dynamic range of the amplifier 460 is given by the interval defined by the positive external power source voltage +VCC and the negative external power source voltage −VCC. Actually, the devices inside the amplifier 460 limit this dynamic range, however, since this deviation can be compensated by adjusting the values of the resistors R1 and R4, taking the dynamic range as above is a fairly reasonable assumption for convenience of explanation.

When the input voltage VI is less than the first dividing voltage VP1 and greater than the second dividing voltage VP2, that is, when the input voltage VI is swinging in an interval in which the output waveform V0 is not clipped, the second drop differential transistor Q2 of the first differential amplifying unit 420 and the second rise differential transistor Q13 of the second differential amplifying unit 430 are turned off. Accordingly, the first drop control transistor Q14 and the second drop control transistor Q16 of the first output voltage control unit 440, the first rise control transistor Q9 and the second rise control transistor Q15 of the second output voltage control unit 450 are also turned off. Since current does not flow through the input resistor R0 that is serially connected between the input voltage VI and the output node NOUT, voltage drop in the input voltage VI does not occur, and the entire input voltage VI is provided to the power amplifier 460 such that a normal operation is performed.

If the input voltage VI approaches the first dividing voltage VP1, the second drop differential transistor Q2 of the first differential amplifying unit 420 enters into an active area, and current begins to flow through the second drop differential transistor Q2, the current flows through the fourth drop differential transistor Q4, and the second drop load transistor Q6 of the first active load unit 425. The second drop load transistor Q6 generates the first output signal OUTS1 and the first output signal OUTS1 is provided to the first drop control transistor Q14 of the first output voltage control unit 440. Here, it is shown that the first output signal OUTS1 flows from the second drop differential transistor Q2 to the second drop load transistor Q6.

Since the current began to flow through the input resistor R0, a voltage drop in the input resistor R0 begins to occur. After the input voltage VI is reduced by the voltage drop of the input voltage across R0, a predetermined voltage lower than the input voltage VI, the reduced input voltage is then provided to the power amplifier 460 thereby clipping the output waveform V0 of the power amplifier 460. Based on the operation of the power amplifier 460, the output waveform V0 is smoothly output from a voltage that is a predetermined degree lower than a voltage that clips the output waveform V0. This is indicated by (i) in FIG. 5.

More specifically, the input voltage VI at which the second drop differential transistor Q2 of the first differential amplifying unit 420 begins to enter an active area is approximately the value of "the first dividing voltage VP1−8*VT", where VT is the threshold voltage of the first through fourth drop differential transistors Q1 through Q4. This is since the first differential amplifying unit 420 has a 2-pair structure of the first through the fourth drop differential transistors Q1 through Q4 in the exemplary embodiment of the present invention shown in FIG. 4. The reference mark (*) as used herein and after stands for basic algebraic multiplication. Also, hereinafter the voltage level at which the second drop differential transistor Q2 begins to enter an active area will be referred to as the first clipping voltage VCP1.

The first clipping voltage VCP1 is approximately 8*VT lower than the level of the input voltage VI of a moment when clipping the output waveform V0 of the power amplifier 460 begins. Thus, VI is the same voltage level as the first dividing voltage VP1 in the embodiment of the present invention. This means that the level of the input voltage VI provided to the power amplifier 460 is reduced from the first clipping voltage VCP1, and from the output aspect the output waveform V0 is smoothly output at a voltage that is approximately 8*VT*AV lower than the voltage at which the output waveform V0 is clipped.

More resistance devices may be placed between the first and third drop differential transistors Q1 and Q3 of the first differential amplifying unit 420, and between the second and fourth drop differential transistors Q2 and Q4 in the embodiment of FIG. 5. Here, the resistance devices may be ordinary resistors or diodes. By adding more resistors or diodes, the output waveform V0 can be controlled more linearly.

If the input voltage VI becomes higher than the first dividing voltage VP1, the current of the second drop differential transistor Q2 of the first differential amplifying unit 420 increases and is provided to the second drop load transistor Q6. Since the first drop load transistor Q5 is in a current mirror relationship with the second drop load transistor Q6, the current of the first drop load transistor Q5 increases and the second output signal OUTS2, a current signal, is generated and provided to the second drop control transistor Q16. Therefore, the second drop control transistor Q16 is turned on.

The emitter current of the second drop control transistor Q16 as well as the collector current of the first drop control transistor Q14 are added to the current flowing through the input resistor R0. In addition, although the current of the first drop control transistor Q14 flows as much as [the fourth drop differential transistor Q4 current * (the current mirror ratio of the second drop load transistor Q6 and the first drop control transistor Q14)], the current of the second drop control transistor Q16 flows approximately as much as [(the collector current of the fourth drop differential transistor Q4–the collector current of the third drop differential transistor Q3) * the current gain value of the second drop control transistor Q16]. Therefore, when the input voltage VI is greater than the first dividing voltage VP1, much more current flows through the input resistor R0 than when the input voltage VI is between the first clipping voltage VCP1 and the first dividing voltage VP1.

This means that although theoretically the input voltage VI becomes greater than the first dividing voltage VP1, the input voltage VI that is input to the power amplifier 460 can be greater than the first dividing voltage VP1 only by a very small value. Since the input voltage VI does not exceed the above value, a voltage at which the output waveform V0 is clipped, that is, the first dividing voltage VP1 over the original plus the very small value, the output waveform V0 of the power amplifier 460 is clipped almost horizontally. This is shown in FIG. 5(ii).

The operations of the second differential amplifying unit 430 and the second output voltage control unit 450, when the input voltage VI approaches the second dividing voltage VP2, are the same as the operations of the first differential amplifying unit 420 and the first output voltage control unit 440 when the input voltage VI approaches the first dividing voltage VP1, except that the direction of currents are opposite. Therefore, a duplicate explanation will be omitted.

The operation of the power amplifier clipping circuit 400 will now be explained by dividing it into three parts according to the value of the input voltage VI. First, in a normal operation interval, the input voltage VI is greater than "the second dividing voltage VP1+8*VT" and less than "the first dividing voltage VP1–8*VT", and there is no current flowing through the input resistor R0. Therefore, the input voltage VI is provided to the power amplifier 460 without any change.

Second, in an interval where the output waveform V0 is smoothly clipped, the input voltage VI is greater than the second dividing voltage VP2 and less than "the second dividing voltage VP2+8 *VT", or the input voltage VI is greater than "the first dividing voltage VP1–8*VT" and less than the first dividing voltage VP1. The current flowing through the input resistor R0 is the collector current of the first rise control transistor Q9 or the collector current of the first drop control transistor Q14. Therefore, the input voltage VI provided to the power amplifier 460 is the "input voltage VI–(the collector current of the first rise control transistor Q9 or the collector current of the first drop control transistor Q14) * input resistor R0".

Third, in an interval where the output waveform V0 is completely clipped, the input voltage VI is greater than the first dividing voltage VP1 or less than the second dividing voltage VP2. The current flowing through the input resistor R0 is "the current of the first drop control transistor Q14+the current of the second drop control transistor Q16" or "the current of the first rise control transistor Q9+the current of the first rise control transistor Q15". Therefore, the input voltage VI provided to the power amplifier 460 is the "input voltage VI–(the current of the first drop control transistor Q14+the current of the second drop control transistor Q16 or the current of the first rise control transistor Q9+the current of the first rise control transistor Q15) * input resistor R0".

According to the power amplifier clipping circuit 400 of the present invention, even when clipping is performed the feedback loop of the power amplifier 460 is not broken but is in a normal state, and therefore a high frequency noise due to the load of the inductor L indicating the speaker does not occur. Also, since a capacitor is not used, there is no discharge of the capacitor that would cause an output waveform V0 less than a capacitor-based output waveform.

In the prior art power amplifier clipping circuit 200, the output waveform V0 has only a normal operation interval and a complete clipping interval, and therefore noise due to a sudden change of the output waveform V0 at a boundary between the normal operation interval and the complete clipping interval may occur. However, in the present invention, such noise cannot occur.

By adding diodes or emitter resistors to the first differential amplifying unit 420 or the second differential amplifying unit 430, the structure of the circuit can be changed so that the first or the second clipping voltage values VCP1 or VCP2 can also be changed.

As described above, the power amplifier clipping circuit according to the present invention prevents a sudden change of an output waveform when the output waveform is clipped due to a provided excessive input voltage, and makes the output waveform occurring immediately after providing the excessive input voltage the same as the original waveform.

So far, optimum embodiments are explained in the drawings and specification, and though specific terminologies are used herein, those are only to explain the present invention by means of example. Therefore, the present invention is not restricted to the above-described embodiments, and many variations are possible within the spirit and scope of the present invention. Accordingly, the scope of the present invention is not limited by the description, but only by the accompanying claims.

What is claimed is:

1. A power amplifier clipping circuit comprising:
    an input voltage level dividing unit which generates a first dividing voltage and a second dividing voltage that divide an interval to which the level of an input voltage belongs;
    a first bias transistor and a second bias transistor which are connected to a positive internal power source voltage, the first and second bias transistors forming a current mirror and providing a bias voltage to a predetermined first differential amplifying unit;
    a third bias transistor which is connected to the first bias transistor and provides a bias voltage to the first differential amplifying unit;

a first constant current source which is connected to the third bias transistor and a negative internal power source voltage, and controls the third bias transistor;

the first differential amplifying unit which receives the first dividing voltage and the input voltage, and if the level of the input voltage is between the first dividing voltage and a predetermined first clipping voltage, generates a first output signal, while if the level of the input voltage exceeds the first dividing voltage, generates a second output signal;

a fourth bias transistor and a fifth bias transistor which are connected to a negative internal power source voltage, the fourth and fifth bias transistors forming a current mirror, and providing a bias voltage to a predetermined second differential amplifying unit;

a sixth bias transistor which is connected to the fourth bias transistor and provides a bias voltage to the second differential amplifying unit;

a second constant current source which is connected to the sixth bias transistor and a positive internal power source voltage, and controls the sixth bias transistor;

the second differential amplifying unit which receives the second dividing voltage and the input voltage, and if the level of the input voltage is between a predetermined second clipping voltage and the second dividing voltage, generates a third output signal, while if the level of the input voltage exceeds the second dividing voltage, generates a fourth output signal;

a first output voltage control unit which is connected between the negative internal power source voltage and an output node in which an input resistor that is serially connected to the input voltage is connected to a power amplifier, and in response to the first and second output signals, lowers the level of the input voltage and provides the input voltage to the power amplifier; and a second output voltage control unit which is connected between the positive internal power source voltage and the output node, and in response to the third and the fourth output signal, raises the level of the input voltage and provides the input voltage to the power amplifier.

2. The power amplifier clipping circuit of claim 1, wherein the input voltage level dividing unit comprises:

a first dividing resistor, an end of which is connected to a positive external power source voltage and the other end of which is connected to a first node generating the first dividing voltage;

a second dividing resistor, an end of which is connected to the first node, and the other end of which is connected to ground;

a third dividing resistor, an end of which is connected to ground, and the other end of which is connected to a second node generating the second dividing voltage; and a fourth dividing resistor, an end of which is connected to the second node, and the other end of which is connected to a negative external power source voltage.

3. The power amplifier clipping circuit of claim 2, wherein the second dividing resistor and the third dividing resistor have an identical resistance value, and the first dividing resistor and the fourth dividing resistor have an identical resistance value.

4. The power amplifier clipping circuit of claim 2, wherein the gain of the power amplifier is given by the value obtained by dividing the sum of the resistance value of the first dividing resistor and the resistance value of the second dividing resistor by the resistance value of the second dividing resistor.

5. The power amplifier clipping circuit of claim 1, wherein the first differential amplifying unit comprises:

a first drop differential transistor, the collector of which is connected to the collector and base of the second bias, and to the base of which the first dividing voltage is provided;

a second drop differential transistor, the collector of which is connected to the collector and base of the second bias transistor and to the base of which the input voltage is provided;

a third drop differential transistor, the emitter of which is connected to the emitter of the first drop differential transistor, the base of which is connected to the base of the third bias transistor, and the collector of which generates the second output signal;

a fourth differential transistor, the emitter of which is connected to the emitter of the second drop differential transistor, and the base of which is connected to the base of the third bias transistor; and a first active load unit which is connected between the collectors of the third and fourth drop differential transistors and the negative internal power source voltage, and generates the first output signal.

6. The power amplifier clipping circuit of claim 5, wherein the first active load unit comprises:

a first drop load transistor, the collector of which is connected to the collector of the third drop differential transistor, and the emitter of which is connected to the negative internal power source voltage; and a second drop load transistor, the collector of which is connected to the collector of the fourth drop differential transistor, the base and collector of which are commonly connected to the base of the first drop load transistor, and the emitter of which is connected to the negative internal power source voltage, wherein the first output signal is output from the bases of the first and second drop load transistors.

7. The power amplifier clipping circuit of claim 5, further comprising:

a plurality of resistance devices between the first and third drop differential transistors, and between the second and fourth drop differential transistors.

8. The power amplifier clipping circuit of claim 1, wherein the first clipping voltage is less than the input voltage of the moment when clipping the output waveform of the power amplifier begins, by 2n times the threshold voltage of the drop differential transistors, where n denotes the number of drop differential transistors.

9. The power amplifier clipping circuit of claim 8, wherein the input voltage when clipping the output waveform of the power amplifier begins has the same level as the first dividing voltage.

10. The power amplifier clipping circuit of claim 1, wherein the second differential amplifying unit comprises:

a first rise differential transistor, the collector of which is connected to the collector and base of the fifth bias transistor, and to the base of which the second dividing voltage is provided;

a second rise differential transistor, the collector of which is connected to the collector and base of the fifth bias transistor, and to the base of which the input voltage is provided;

a third rise differential transistor, the emitter of which is connected to the emitter of the first rise differential transistor, the base of which is connected to the base of the sixth bias transistor, and the collector of which generates the fourth output signal;

a fourth rise differential transistor, the emitter of which is connected to the emitter of the second rise differential transistor, and the base of which is connected to the base of the sixth bias transistor; and a second active load unit which is connected between the collectors of the third and fourth rise differential transistors, and the positive internal power source voltage, and generates the third output signal.

11. The power amplifier clipping circuit of claim 10, wherein the second active load unit comprises:

a first rise load transistor, the collector of which is connected to the collector of the third rise differential transistor, and the emitter of which is connected to the positive internal power source voltage; and a second rise load transistor, the collector of which is connected to the collector of the fourth rise differential transistor, the base and collector of which are commonly connected to the base of the first rise load transistor, and the emitter of which is connected to the positive internal power source voltage, wherein the third output signal is output from the bases of the first and second rise load transistors.

12. The power amplifier clipping circuit of claim 10, further comprising:

a plurality of resistance devices between the first and third rise differential transistors, and between the second and fourth rise differential transistors.

13. The power amplifier clipping circuit of claim 1, wherein the second clipping voltage is greater than the input voltage of the moment when clipping the output waveform of the power amplifier begins, by 2m times the threshold voltage of the rise differential transistors, where m denotes the number of rise differential transistors.

14. The power amplifier clipping circuit of claim 13, wherein the input voltage of the moment when clipping the output waveform of the power amplifier begins has the same level as the second dividing voltage.

15. The power amplifier clipping circuit of claim 1, wherein the first output voltage control unit comprises:

a first drop control transistor, the emitter of which is connected to the negative internal power source voltage, to the base of which the first output signal is provided, and the collector of which is connected to the output node; and a second drop control transistor, the emitter of which is connected to the negative internal power source voltage, to the base of which the second output signal is provided, and the collector of which is connected to the output node.

16. The power amplifier clipping circuit of claim 1, wherein the second output voltage control unit comprises:

a first rise control transistor, the emitter of which is connected to the positive internal power source voltage, to the base of which the third output signal is provided, and the collector of which is connected to the output node; and a second rise control transistor, the emitter of which is connected to the positive internal power source voltage, to the base of which the fourth output signal is provided, and the collector of which is connected to the output node.

17. A method for clipping a power amplifier output, the method comprising:

receiving an input voltage;

generating first and second dividing voltages that divide an interval of the input voltage;

comparing the input voltage with the first dividing voltage and with a predetermined first clipping voltage;

generating a first output signal if the level of the input voltage is between the first dividing voltage and the first clipping voltage;

generating a second output signal if the level of the input voltage exceeds the first dividing voltage;

comparing the input voltage with the second dividing voltage and with a predetermined second clipping voltage;

generating a third output signal if the level of the input voltage is between the second clipping voltage and the second dividing voltage;

generating a fourth output signal if the level of the input voltage exceeds the second dividing voltage;

adjusting downward the level of the input voltage in response to the first and second output signals;

adjusting upward the level of the input voltage in response to the third and fourth output signals; and providing the adjusted input voltage to the power amplifier.

18. A method as defined in claim 17 wherein at least one of:

the input voltage has the same level as the first dividing voltage at the moment that clipping begins;

the first clipping voltage is a predetermined amount less than the input voltage at the moment that clipping begins; and the second clipping voltage is a predetermined amount greater than the input voltage at the moment that clipping begins.

19. A clipping circuit for a power amplifier, the clipping circuit comprising:

receiver means for receiving an input voltage;

divider means for generating first and second dividing voltages that divide an interval of the input voltage;

first comparator means for comparing the input voltage with the first dividing voltage and with a predetermined first clipping voltage;

first generator means for generating a first output signal if the level of the input voltage is between the first dividing voltage and the first clipping voltage;

second generator means for generating a second output signal if the level of the input voltage exceeds the first dividing voltage;

second comparator means for comparing the input voltage with the second dividing voltage and with a predetermined second clipping voltage;

third generator means for generating a third output signal if the level of the input voltage is between the second clipping voltage and the second dividing voltage;

fourth generator means for generating a fourth output signal if the level of the input voltage exceeds the second dividing voltage;

first adjuster means for adjusting downward the level of the input voltage in response to the first and second output signals;

second adjuster means for adjusting upward the level of the input voltage in response to the third and fourth output signals; and provider means for providing the adjusted input voltage to the power amplifier.

20. A clipping circuit as defined in claim 19, further comprising at least one of:

first assignment means for assigning the first dividing voltage substantially equal to the input voltage level at the moment that clipping begins;

second assignment means for assigning the first clipping voltage as a predetermined amount less than the input voltage at the moment that clipping begins; and third assignment means for assigning the second clipping voltage as a predetermined amount greater than the input voltage at the moment that clipping begins.

* * * * *